United States Patent
Le et al.

(10) Patent No.: US 6,404,218 B1
(45) Date of Patent: Jun. 11, 2002

(54) MULTIPLE END OF TEST SIGNAL FOR EVENT BASED TEST SYSTEM

(75) Inventors: Anthony Le; James Alan Turnquist; Rochit Rajsuman; Shigeru Sugamori, all of Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/559,365

(22) Filed: Apr. 24, 2000

(51) Int. Cl.[7] ............................................... G01R 31/02
(52) U.S. Cl. ....................................... 324/763; 324/765
(58) Field of Search .............................. 324/73.1, 753, 324/751, 750, 763, 765, 158.1; 714/724, 730, 731, 736, 743, 744

(56) References Cited

U.S. PATENT DOCUMENTS 4,931,723 A * 6/1990 Jeffrey et al. ............... 714/730
6,073,259 A * 6/2000 Sartschev et al. ........... 714/724
6,157,200 A * 12/2000 Okayasu ..................... 324/753

* cited by examiner

Primary Examiner—Michael J. Sherry
Assistant Examiner—Minh N. Tang
(74) Attorney, Agent, or Firm—Muramatsu & Associates

(57) ABSTRACT

An event based test system for testing semiconductor devices under test (DUT). The event based test system is freely configured to a plurality of groups of sin units where each group is able to perform test operations independently from the other. The start and end timings of the test in each group are independently made by generating multiple end of test signals. The event based test system includes a plurality of pin units to be assigned to pins of the DUT, a signal generator for generating an end of test signal for indicating an end of current test which is generated for each pin unit independently from other pin units, and a system controller for controlling an overall operation in the event based test system by communicating with each pin unit. The end of test signal for each pin unit is selected by condition specified by the system controller and the selected end of test signal is provided to the system controller and to the other pin units.

14 Claims, 9 Drawing Sheets

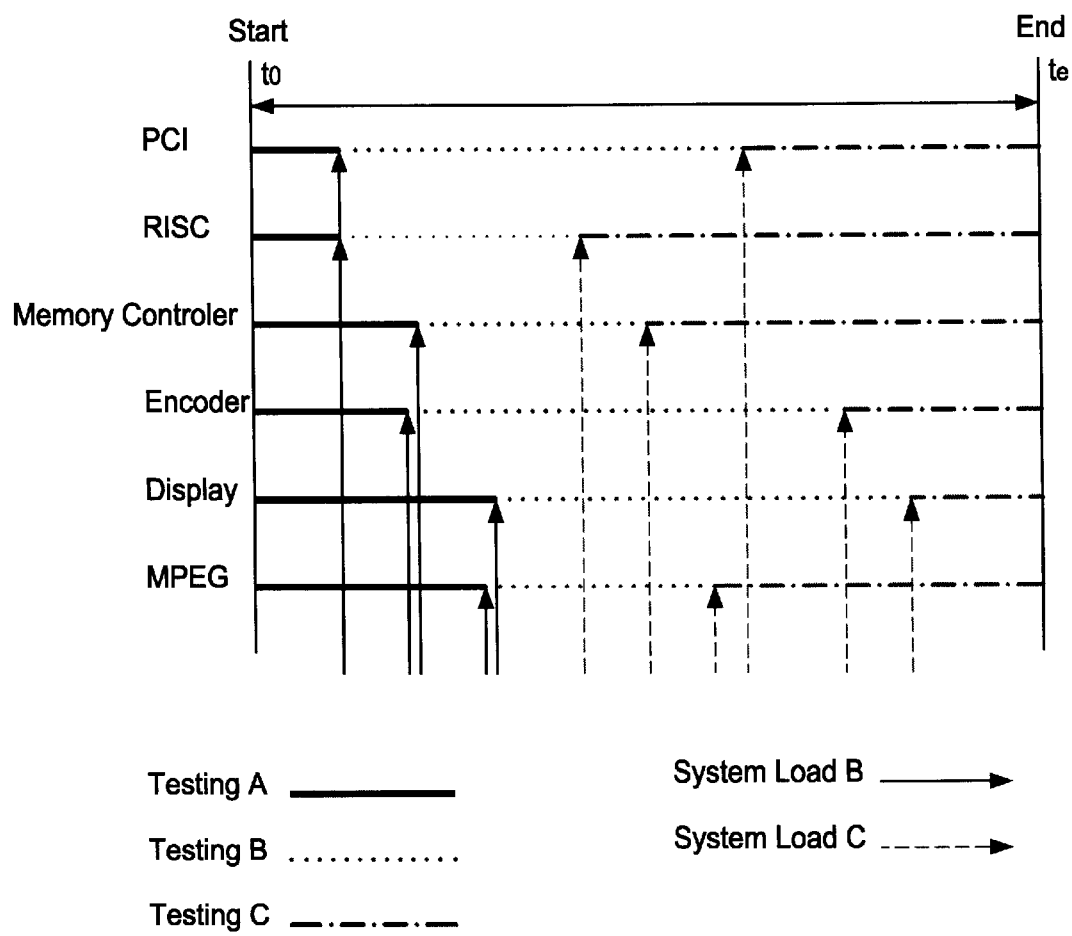

Fig.9A (Conventional Test System Memory Management)

| PCI T1 | RISC T1 | Memory T1 | Encoder T1 | Display T1 | PCI T2 | ............ |
|---|---|---|---|---|---|---|

Pin Number

Fig.9B (Event Test System Memory Management)

| PCI T1 | PCI T2 | PCI ............ |||
|---|---|---|---|---|
| RISC T1 | RISC T2 | RISC ............ |||
| Memory T1 | Memory T2 | Memory ............ |||
| Encoder T1 | Encoder T2 | Encoder ............ |||
| Display T1 | Display T2 | Display ............ |||

Pin Number

MULTIPLE END OF TEST SIGNAL FOR EVENT BASED TEST SYSTEM

FIELD OF THE INVENTION

This invention relates to an event based semiconductor test system for testing semiconductor devices, and more particularly, to an event based test system having means for generating multiple end of test signals each indicating an end of test in a corresponding pin unit or a pin-unit group where two or more pin-unit groups in the test system perform test operations independently from one another.

BACKGROUND OF THE INVENTION

In testing semiconductor devices such as ICs and LSIs by a semiconductor test system, such as an IC tester, a semiconductor IC device to be tested is provided with test signals or test patterns produced by a semiconductor test system at its appropriate pins at predetermined test timings. The semiconductor test system receives output signals from the IC device under test (DUT) in response to the test signals. The output signals are sampled by strobe signals with predetermined timings to be compared with expected data to determine whether the DUT functions correctly or not.

Traditionally, timings of the test signals and strobe signals are defined relative to a tester rate or a tester cycle of the semiconductor test system. Further, waveforms and vectors of the test signals are also defined with respect to each tester cycle. Such a test system is sometimes called a cycle based test system. In a cycle based test system, various different types of data are necessary and thus data processing therein tends to be complicated. Thus, it is considered that a cycle based test system is difficult to achieve a per-pin architecture where hardware and software for each tester pin is independent from one another.

FIG. 1 is a schematic diagram showing an example of such a cycle based test system. In FIG. 1, a sequence controller 12 is a tester processor provided within the semiconductor test system for controlling the operation of the test system. Based on address data from the sequence controller 12, a pattern memory 14 produces pattern data and waveform data relative to each tester cycle. The pattern data and waveform data are provided to a pin data formatter 17 through a pin data selector 16. Based on the address data from the sequence controller 12, a timing memory 13 generates timing data which typically specifies delay times relative to the start of each tester cycle. The timing data is also provided to the pin data formatter 17.

A test signal is produced by the pin data formatter 17 with use of the pattern data and waveform data from the pattern memory 14 and the timing data from the timing memory 13. A pin driver/comparator 18 applies the test signal to a device under test (DUT) 19 with a specified amplitude and slew rate. The pin data selector 16 selectively transfers the pattern data and waveform data for corresponding tester pins to the pin data formatter 17. In other words, the pin data formatter 17 is configured by a plurality of data formatters with one-to-one correspondence with the tester pins (test channels). Similarly, the pin driver/comparator 18 as also configured by a large number of drivers and comparators corresponding to the tester pins.

The pin driver/comparator 18 receives a response signal from the DUT 19 resulted from the test signal. in the driver/comparator 18, the response signal is converted to a logic signal by an analog comparator with reference to predetermined threshold voltages by the timings of strobe signals, and the resultant logic signal is compared with expected value data by a logic Comparator. The result of the logic comparison indicates pass/fail of the DUT which is stored in a failure memory 15 corresponding to the address of the DUT 19. The test results stored in the failure memory 15 is used in a failure analysis stage after the test.

In the cycle based test system noted above, all of the tester pins (DUT pins) share the same memory areas in the pattern memory 14 and timing memory 13 that store the pattern data and timing data. In other words, each tester pin cannot operate independently from one another. This common sharing of storage space requires the test program to be executed from beginning to the end for all tester pins. Thus, the cycle based test system inherently requires only one end-of-test indication, i.e., an end-of-test (EOT) signal generation mechanism.

In testing complicated recent semiconductor devices by such a conventional test system, there arises a problem that a test time increases when the device under test includes two or more different functional blocks. For example, a system-on-chip (SOC) IC device has a plurality of functional blocks or cores therein to perform an intended overall function. A typical SOC device requires multiple clock frequencies for the functional blocks (cores or modules) that compose the SOC device. Sometimes, these clock frequencies do not share any common harmonics and are therefore asynchronous with one another.

An example of SOC device is shown in FIG. 2 which is a typical multimedia SOC. The SOC 19 has several functional blocks or functional cores including a PLL (phase lock loop) 22, a TV encoder 23, a memory controller 24, a display controller 25, a PCI module 26, a RISC 27, and an MPEG engine 28. In FIG. 2, each functional core shows the clock frequency which is asynchronous with one another.

Since each functional core in this example operates under different clock frequencies, each of the functional cores has to be tested separately. In this cycle based tent system, however, since the test signals and strobes are generated based on the data from the same pattern memory and timing memory, it is not possible to generate test signals asynchronous to one another. In other words, the conventional cycle based test system cannot conduct different types of test in a parallel fashion at the same time. Since each functional core has to be tested one by one in a series fashion, the total testing time is the sum of all functional cores' test times.

FIG. 3 shows an example of process for testing the SOC 19 of FIG. 2. As noted above, each functional core is tested one by one in a series fashion from a test start t0 to a test end te. The test system tests the PCI block which starts at t0 and ends at t1, then tests the RISC block which starts at t1 and ends t2, and so on. This results in that while one of the functional cores is tested (solid line in FIG. 3), all the other cores are in idle (dotted line in FIG. 3). Therefore, it takes a very long time to complete the test of the SOC device of FIG. 2.

SUMMARY OF THE INVENTION

Therefore, it is an object of the present invention to provide an event based semiconductor test system which is able to perform a plurality of different tests in a parallel fashion at the same time.

It is another object of the present invention to provide an event based semiconductor test system which is able to perform a plurality of different tests in a parallel fashion at the same time by incorporating means for generating multiple end of test signals.

It is a further object of the present invention to provide an event based semiconductor test system which is capable of generating multiple signals each indicating an end of test in a pin-unit group where each pin-unit group conducts test operations independently from one another.

The present invention is an event based test system for testing an electronics device under test (DUT) by producing events of various timings for supplying test signals to the DUT and evaluating an output of the DUT at the timings of strobe signals. The event based test system is freely configured by a plurality of groups of tester pins or pin units where each group is able to perform test operations independently from the other. The start and end timings of the test in each group are independently made by means of generating multiple end of test signals.

In the present invention, the event test system includes a plurality of pin units to be assigned to pins of a semiconductor device under test (DUT) for testing the DUT where each of the pin units operates independently from one another, and each of the pin units has an event memory for storing event timing data for producing test signals to be applied to the corresponding pin of the DUT, and an event controller for controlling an overall operation of the pin unit by generating the test signals based on the event timing data from the event memory and evaluating a response output of the DUT.

The event based test system further includes means for generating an end of test signal for indicating an end of current test that has been performed by a corresponding pin unit where the end of test signal is generated for each pin unit independently from other pin units, and a system controller for controlling an overall operation in the event based test system by communicating with the event controller in each pin unit and providing the event timing data to the event memory in each pin unit. The end of test signal for each pin unit is selected by condition specified by the system controller and the selected end of test signal is provided to the system controller and to the other pin units.

According to the present invention, the event based semiconductor test system is capable of producing the events of test signals with various timings based on the event data stored in the event memory to evaluate the semiconductor device. The event based test system includes a plurality of pin units each of which is capable of producing a test signal for a specified pin of the DUT and means for generating an end of test signal with respect to each pin unit independently from the other pin units.

Therefore, the event based test system is capable of performing a plurality of different tests in a parallel fashion at the same time. Further, the event based test system can freely assign a plurality of pin units to several pin-unit groups and generate multiple signals each indicating an end of test in a corresponding pin-unit group where each pin-unit group carries out test operations independently from one another. Thus, the event based test system can perform a plurality of different tests in parallel at the same time.

BRIEF DESCRIPTION OF THE DRAWINGS

FIG. 8 is a timing chart showing a test process for testing the system-on-chip (SOC) device of FIG. 2 by the event based test system of the present invention.

FIGS. 9A and 9B are schematic diagrams showing a difference in the memory management between the cycle based test system in the conventional technology and the event based test system of the present invention.

DETAILED DESCRIPTION OF THE PREFERRED EMBODIMENT

Figure 4:
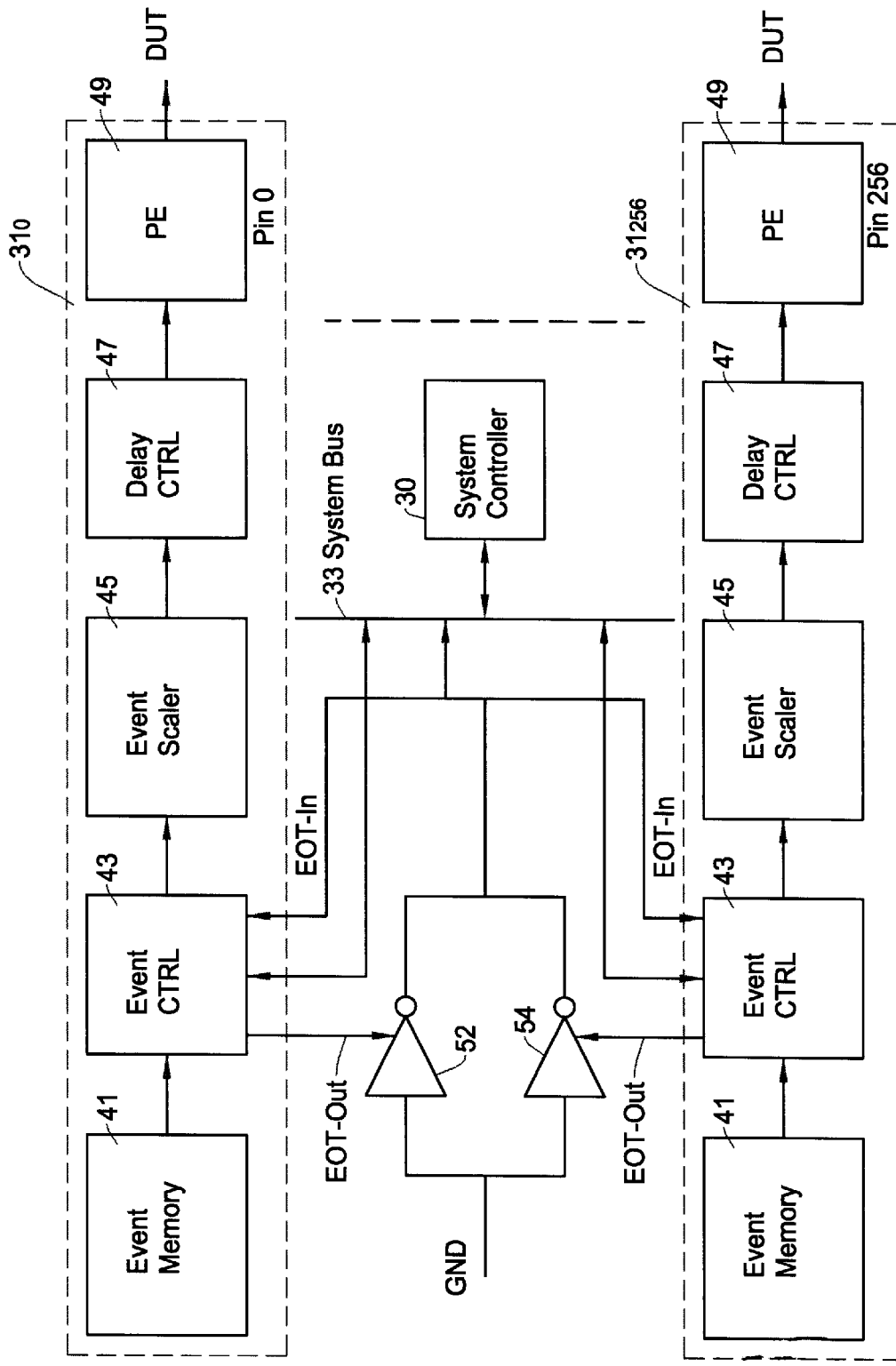
FIG. 4 is a schematic block diagram showing a basic structure of an event based test system of the present invention having capability of generating multiple end of test signals.

FIG. 4 shows a basic structure of an event based test system of the present invention. In the event based test system, each tester pin conducts a test operation independently from one another and produces an end of test signal independently from one another. In an event based test system, desired test signals and strobe signals are Produced based on event data from an event memory directly on a per-pin basis. In practice, since any functional block such as a functional core of a system-on-chip (SOC) device is interfaced via a plurality of device pins, pin units (tester pins) of the event test system are grouped into several pin-unit groups (tester modules). For example, the test system may include eight pin-unit groups where 32 pin units (tester pins) or 64 pin units are assigned to one pin-unit group. In the present invention, each pin-unit group operates independently from the other. Each pin-unit group generates an end of test (EOT) signal when an intended test ends or a failure is detected in the device under test (DUT).

In an event based test system, events are defined as any changes of the logic state in signals to be used for testing a semiconductor device under test. For example, such changes are rising and falling edges of test signals or timing edges of strobe signals. The timings of the events are defined with respect to a time length from a reference time point. Typically, such a reference time point is a timing of the previous event, thus, timing of such an event is expressed by a tire difference between the previous event and a current event. Alternatively, such a reference time point is a fixed start time common to all of the events.

In an event based test system, since the timing data in a timing memory (event memory) does not need to include complicated information regarding waveform, vector, delay etc. at each and every test cycle, the description of the timing data can be dramatically simplified. Test signals and strobes can he produced directly from the event timing data. Because this simplicity, each of the tester pins (pin units) can operate independently from one another. The details of the event based test system and difference from the conventional cycle based test system is given in U.S. application Ser. No. 09/340,371 "Event Based Semiconductor Test System" owned by the same assignee of this invention.

In the event based test system, as noted above, typically, the timing (event) data for each event stored in an event memory is expressed by a time difference between the current event and the last event. Since such a time difference between the adjacent events (delta time) is small, unlike a time difference from a fixed start point (absolute time), size of the data in the memory can also be small, resulting in the reduction of the memory capacity.

For producing high resolution timings, the time length (delay value) between the events is defined by a combination of an integer multiple of a reference clock cycle (integer part or event count) and a fraction of the reference clock cycle (fractional part or event vernier). A timing relationship between the event count and the event vernier is shown in timing charts of FIGS. 5A–5E. In this example, a reference clock of FIG. 5A has a clock cycle or a clock period T. Event 0, Event 1 and Event 2 are related in timings as shown in FIG. 5C.

To describe Event 1 with reference to Event 0, a time difference (delay) $\Delta V_1$ between the two events is defined in an event memory. The timing of Event 2 is defined by a time difference (delay) $\Delta V_2$ from Event 1. Similarly, the timing of Event 3 in FIG. 5E is defined by a time difference (delay) $\Delta V_3$ from Event 3. In the event test system, the timing data in the event memory is read out and summed up to all of the previous events to produce an ultimate timing of the current event.

Therefore, in the example of FIG. 5C, to produce Event the timing relationship of FIG. 5B is used in which $N_1T$ denotes the event count which is N. times of the reference clock period T and $\Delta_1T$ denotes the event vernier which is a fraction of the reference clock period T. Similarly, to produce Event 3 in FIG. 5E with reference to Event 0, the timing data for all prior events are summed up to produce an overall time difference expressed by $N_3T+\Delta_3T$ wherein $N_3T$ denotes the event count which is $N_3$ times of the reference clock period T and $A_3T$ denotes the event vernier which is a fraction of the reference clock period T.

Referring back to FIG. 4, the event based test system includes a large number of pin units 31 (tester pins or event testers) each being capable of independently supplying a test signal to a corresponding pin of the DUT and evaluating a response output of the DUT. In the example of FIG. 4, 256 pin units $31_1$–$31_{256}$ are provided in the event based test system. Drivers 52 and 54 receive and send end of test signals to and from the pin units $31_1$–$31_{256}$. A host computer 30 (system controller) communicates with all of the pin units 31 through a system bus 33 and controls an overall operation of the event based test system.

Each pin unit 31 includes an event memory 41, an event controller 43, an event scaler 45, a delay controller 47 and a pin electronics (PE) 49. In each of the pin units 31, the event memory 41 stores event data which is basically formed of event timing data and event type data. Typically, the event timing data defines the time difference between two adjacent events. Such event timing data is used to produce an overall delay time of a current event from a reference point as shown in FIGS. 5B and 5E. The event type data defines the type of event such as a drive event and a sampling event shown in FIGS. 5C and 5E.

The event controller 43 is a controller such as a microprocessor to control an overall operation of the pin unit 31. The event controller 43 receives the instructions from the system controller (host computer) 30 through the system bus 33 to load test programs in the pin unit 31 and execute the test programs. The event controller 43 provides a test signal to a specific pin of the device under test and evaluates a response output of the device under test. The event controller 43 computes an overall delay of each event by summing the event timing data from the event memory 41. The event controller 43 also functions as an address sequencer to provide address data to the event memory 41 in the pin unit independently from the other pin units.

Figure 5:
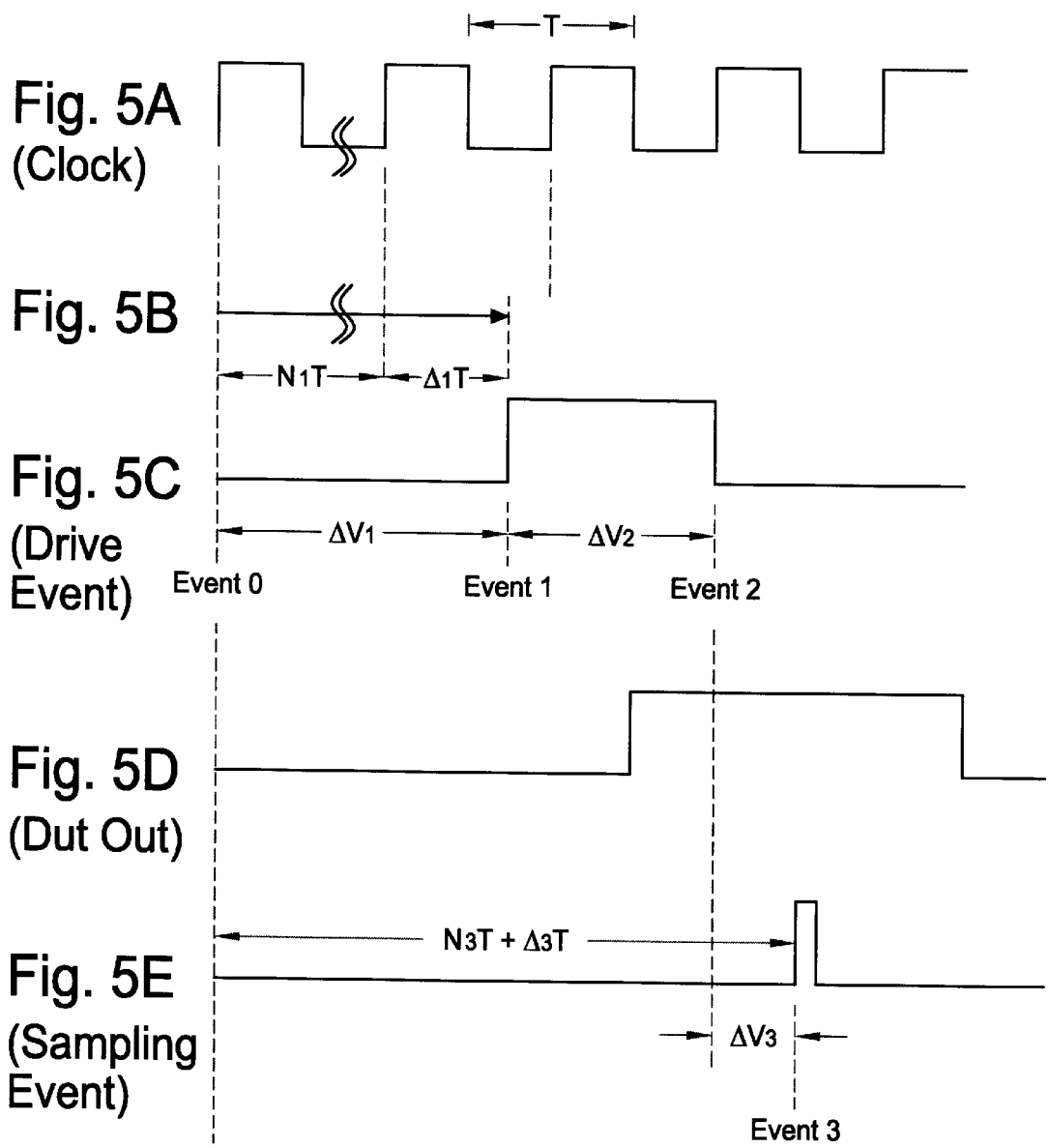
FIGS. 5A–5E are timing diagrams showing an example of timing relationships between the events to be generated and corresponding timing data in the event based test system.

As shown in FIG. 5, the time difference between two adjacent events defined by the event timing data is configured by an integer multiple of a reference clock period and a fraction of the reference clock period. Thus, in the process of computing the overall delay time, a carry over operation may be involved when the sum of the fractional data exceeds the reference clock period.

The event scaler 45 is provided for scaling the overall delay data from the event controller 43. The event scaler changes the overall delay data in proportion to a scaling factor. The delay controller 47 is to produce the test pattern, such as driving events and sampling events, based on the scaled overall delay time from the event scaler 45. The test pattern is applied to the DUT through the pin electronics which includes a driver for transmitting the test pattern (driving event) to the DUT and a comparator for comparing the response output from the DUT by the timing of the sampling event.

Each pin unit 31 can be started and stopped independently from other pin units in the same test system. For example, when an error is detected in the corresponding pin, or when the test pattern is exhausted, the pin unit 31 stops its test operation. In the present invention, each pin unit 31 sends such an end of test (EOT) signal to other pin units and receives an end of test (EOT) signal from the other pin units. The drivers 52 and 54 buffer the end of test (EOT) signals to and from the pin units. As will be described later with reference to FIG. 6, the drivers 52 and 54 include means for selecting the end of test signals based on specified conditions.

In the present invention, each pin unit 31 is associated with two kinds of end of test signal, an end of test output (EOT-Out) signal and an end of test input (EOT-In) signal. The event controller 43 in each of the pin units 31 of FIG. 4 generates an EOT-Out signal and receives an EOT-In signal. For example, an EOT-In signal is used by the pin unit to stop executing the test programs and an EOT-Out signal is used as a system interrupt to request system services.

Figure 6:
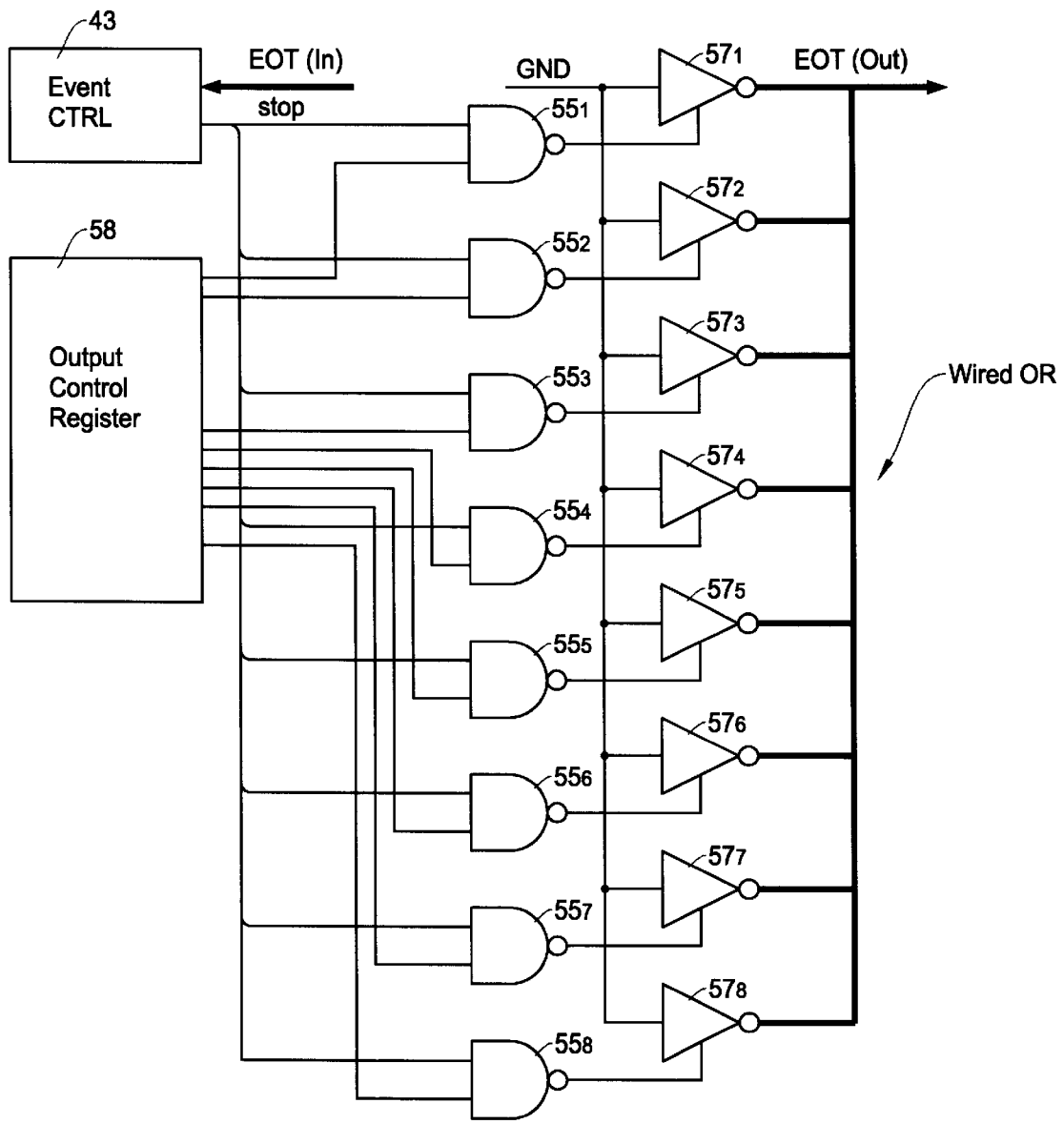
FIG. 6 is a circuit diagram showing an example of circuit structure in an end of test signal generation logic in the event test system of the present invention.

FIG. 6 shows an example of circuit diagram for generating an EOT-Out signal by the pin unit 31. The event controller 43 produces end of test signals based on various conditions including types of failure detected on the corresponding pin of the DUT, conditions specified by the user, the end of test program, and the like. An output control register 58 is provided to select one or more types of end of test signals from the event controller 43. The system program from the system controller 30 controls the contents of the output control register 58.

AND gates $55_1$–$55_8$ are respectively connected to the output of the event controller 43 and the register 58 so that only the selected end of test signals are generated at the outputs of drivers $57_1$–$57_8$. The outputs of the drivers $57_1$–$57_8$ are connected in a wired-OR form. Although not shown, end of test input (EOT-In) signals to be supplied to the event controllers 43 are generated by the configuration similar to the above. An input control register such as the output control register 58 may be provided to produce selection signals to select types of EOT-In signal to be transmitted to the event controllers 43.

Because a semiconductor device to be tested has a large number of I/O pins, such as 32 pins or more, the pin units 31 are grouped into several pin-unit groups (tester modules). In one example, the test system of the present invention has eight different groups of pin units that can operate independently from one another. Thus, in the example of FIG. 4 having 256 pin units $31_1$–$31_{256}$, each pin-unit group (tester module) has 32 pin units where the same end of test signal is assigned to 32 pin units in the same group.

Figure 7:
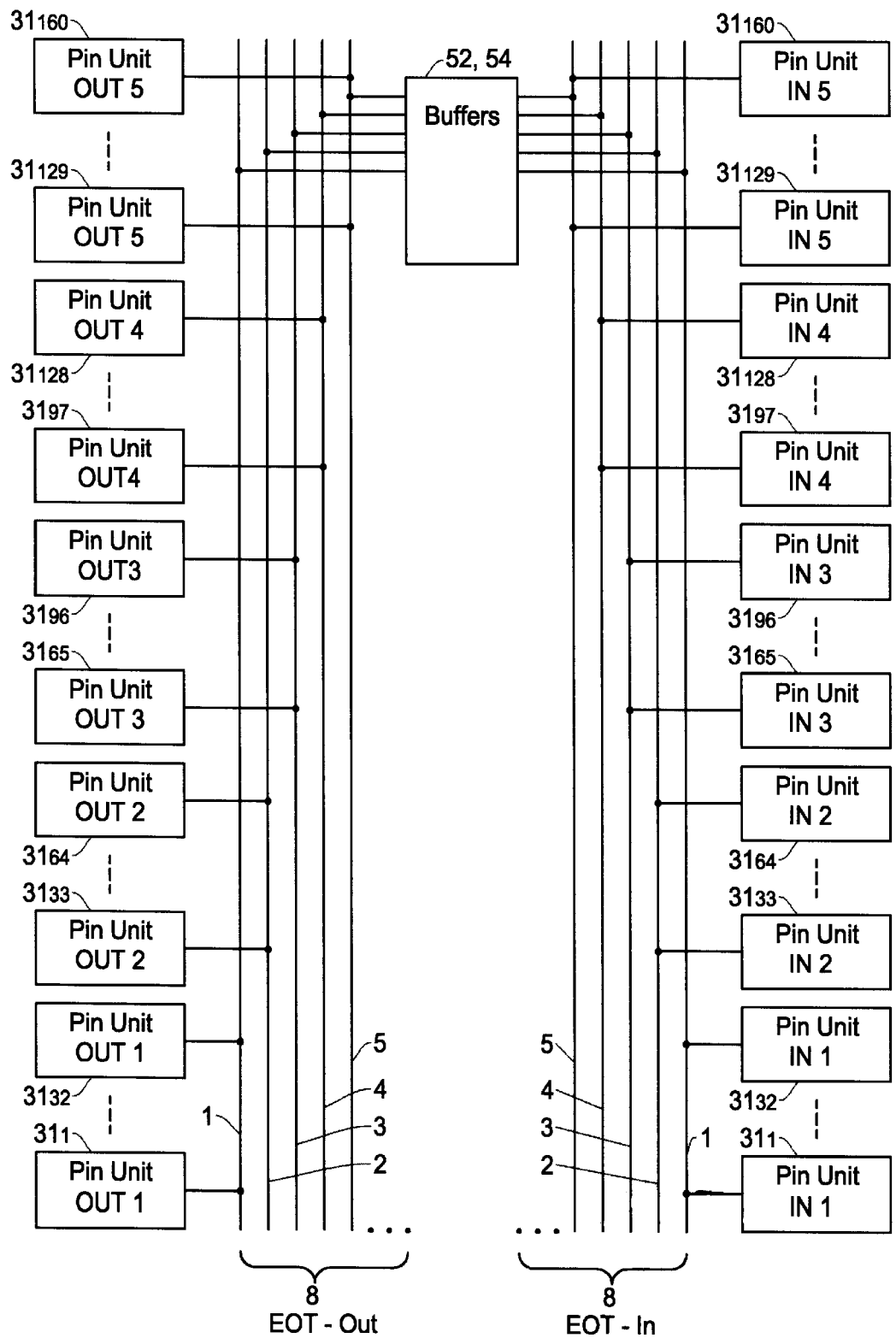
FIG. 7 is a schematic diagram showing an example where pin units are grouped into eight pin-unit groups each including 32 pin units and generating an end of test signal separately from the other groups.

Such a configuration is shown in FIG. 7 where eight end of test output (EOT-Out) signals and eight end of test input (EOT-In) signals are allocated to respective eight pin-unit groups. In this example, EOT-In line 1 and EOT-Out line 1 are allocated to the first pin-unit group having the pin units $31_1$–$31_{32}$. EOT-In line 2 and EOT-Out line 2 are allocated to the second pin-unit group having the pin units $31_{33}$–$31_{64}$. In this manner, EOT-In lines 1–8 and EOT-In lines 1–8 are respectively allocated to the pin units $31_1$–$31_{256}$, although only 160 pin units are shown in FIG. 7 for simplicity.

As noted above with reference to FIG. 4, each pin unit 31 contains, such as in the event controller 43, logic to generate an end of test signal. An end of test signal may be generated by various conditions which are controlled by the system software through the output control register 58 (FIG. 6). The selected end of test signal is open-drain (wired OR) as shown in FIG. 6. Eight such open-drain end of test outputs are connected to one of the EOT-Out lines 1–8. Similarly, eight open-drain end of test inputs are connected to one of the EOT-In lines 1–8.

As noted above, the functions of the EOT signals include to request all pin units in the same pin-unit group (tester module) to stop execution of the test program, request the system service, and request to stop the current test and proceed to the next test. Accordingly, eight tester modules (pin-unit groups) can conduct eight different tests on the device under test in parallel at the same time.

Figure 1:
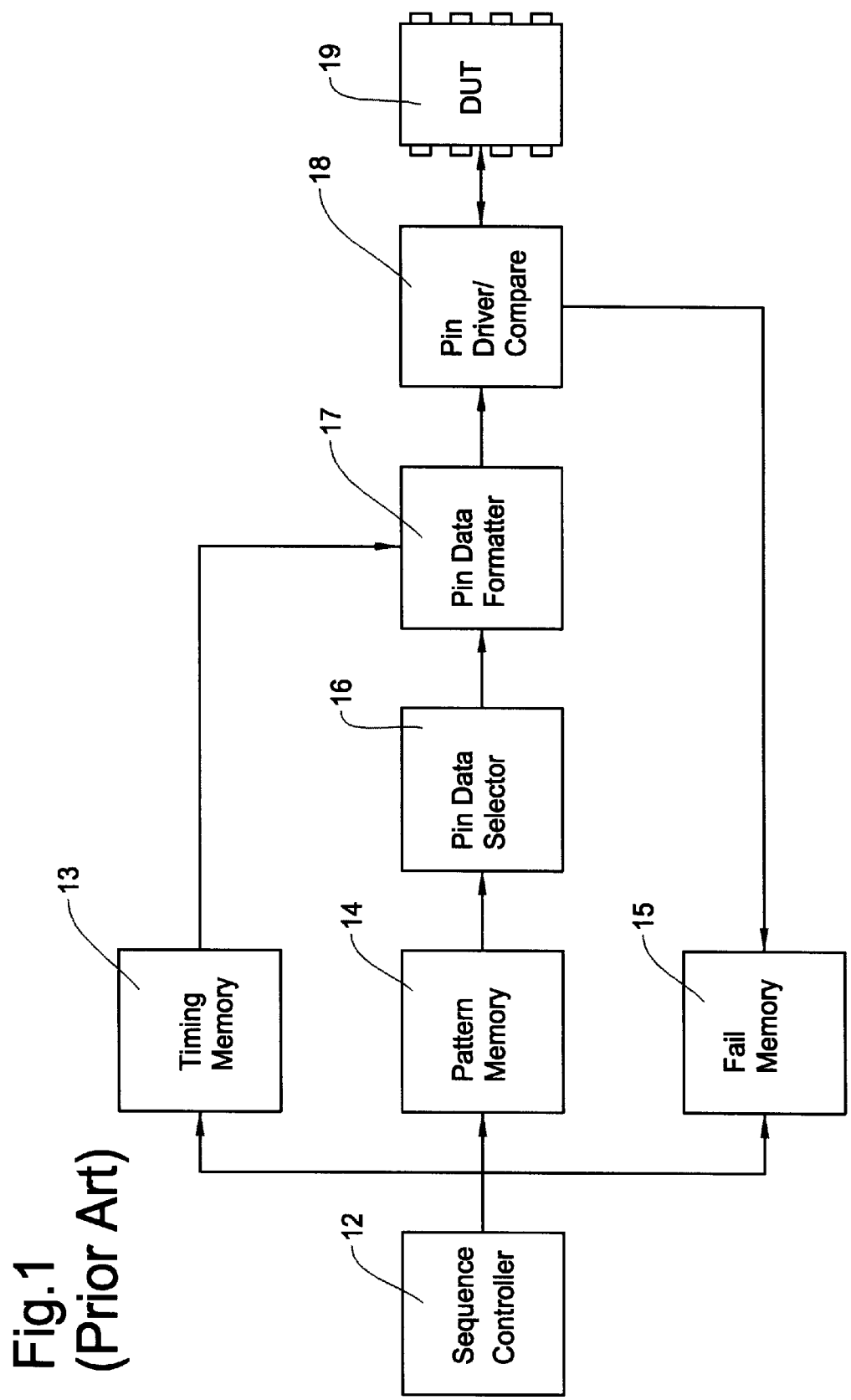
FIG. 1 is a schematic block diagram showing a basic structure of a conventional cycle based test system.
Figure 2:
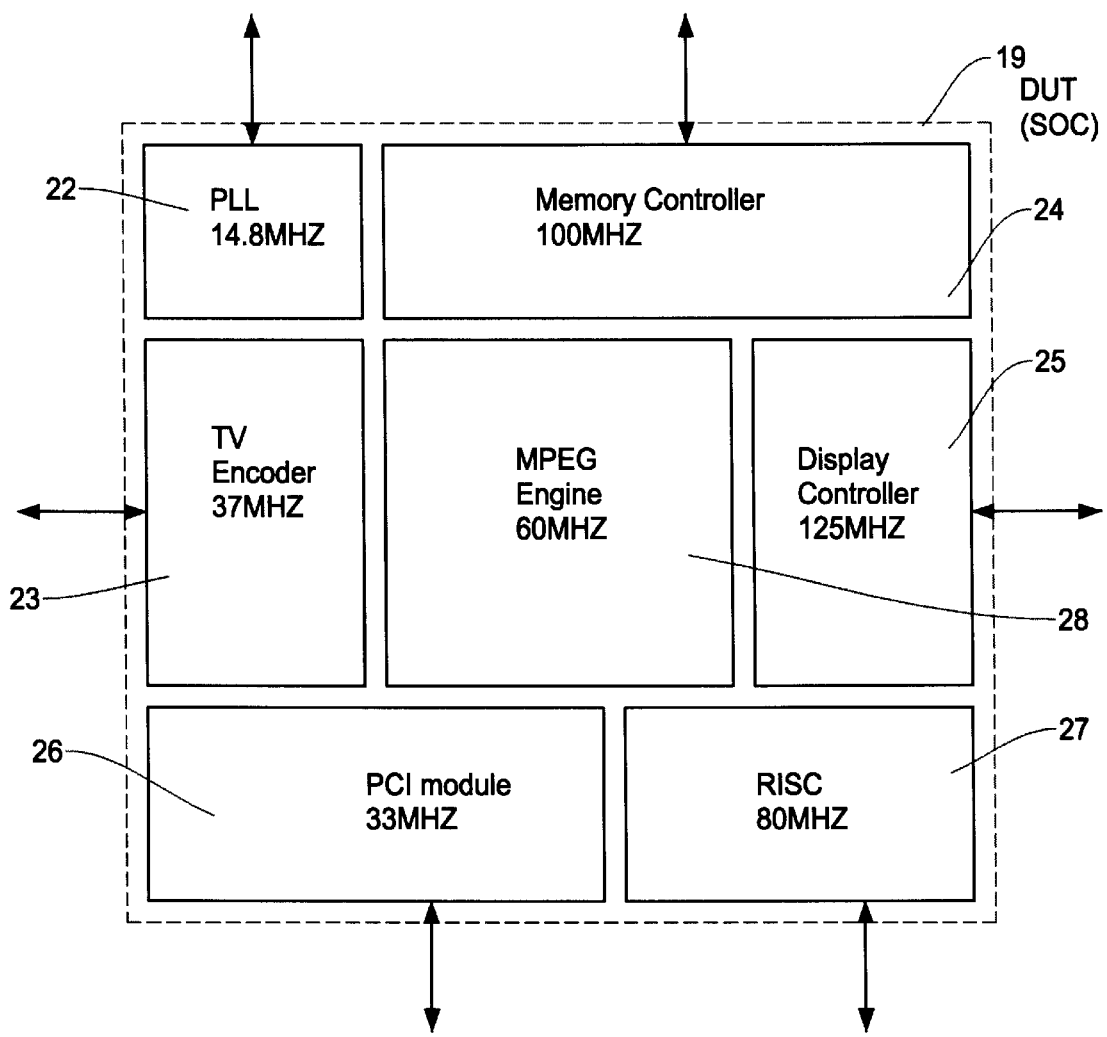
FIG. 2 is a block diagram showing an example of semiconductor device to be tested which is a system-on-chip (SOC) device having a plurality of functional cores.
Figure 3:
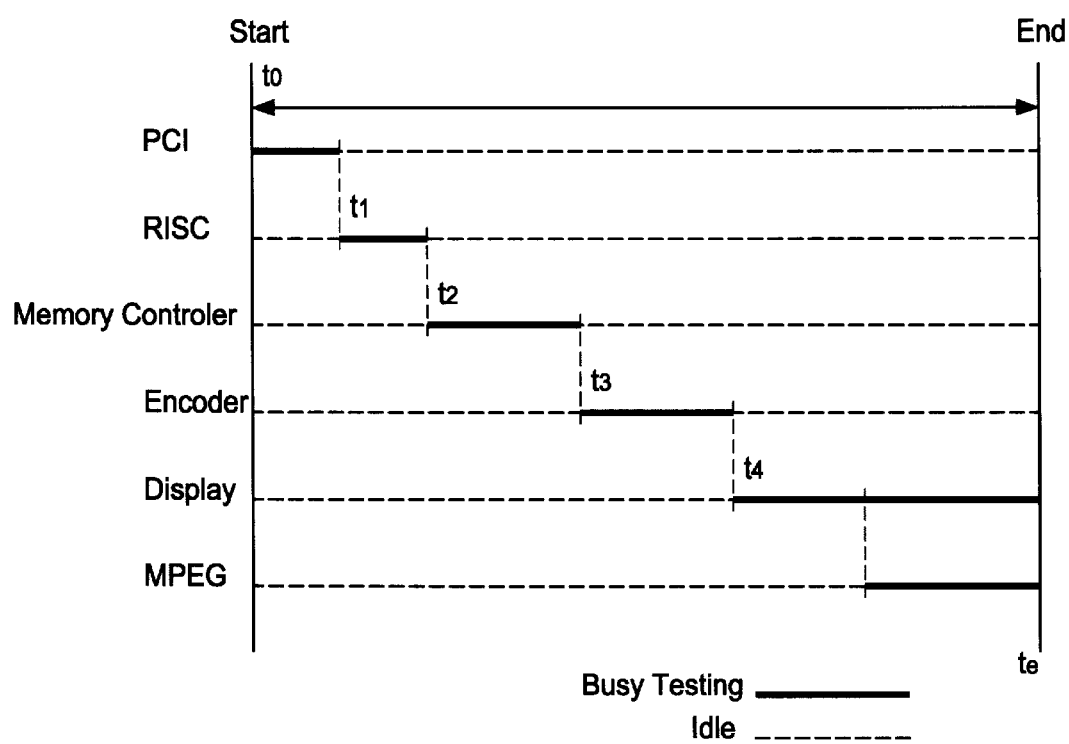
FIG. 3 is a timing chart showing a test process for testing the system-on-chip (SOC) of FIG. 2 by the cycle based test system of FIG. 1.

FIG. 8 shows an example of test time allocation in the event test system of the present invention when testing the system-on-chip (SOC) ICs such as shown in FIG. 2. FIG. 8 shows device test time improvement over the conventional example of FIG. 3. In this example, the event test system assigns the first pin-unit group (pin units $31_1$–$31_{32}$) and the EOT line 1 to the PCI core of the device under test (DUT) the second pin-unit group (pin units $31_{33}$–$31_{64}$) and the EOT line 2 to the RISC core of the DUT, and the like.

Therefore, PCI, RISC, Memory controller, Encoder and Display cores are respectively tested by the pin-unit groups (tester modules) 1–5 while the EOT lines 1–5 are respectively allocated to the pin-units groups 1–5. At the end of each functional core test, an EOT output signal is asserted to inform the system controller 30 to request servicing. At the detection of the EOT signal, the test system controller 30 will load the next event test program and start the functional core's next test program without interrupting the other pin-unit group from executing their respective event test programs.

In FIG. 8, it is assumed that three test programs A, B and C are to be used to evaluate the SOC under test. At each detection of the EOT signal in the execution of the test program A in the respective functional core testing, the test system loads the next test program B. Further, at each detection of the EOT signal in the execution of the test program B in the respective functional core testing, the test system loads the next test program C. Since each test program can be executed for each functional core independently from the other cores, complete parallel tests can be carried out, thereby dramatically decreasing an overall test time.

FIGS. 9A and 9B show differences in the memory management architecture between the conventional cycle based test system and the event based test system of the present invention. For the conventional test system, a single address sequencer controls a pattern memory for generating the test pattern and a failure memory for storing the failure information.

Thus, as shown in FIG. 9A, in the failure analysis process for example, the failure memory is accessed in a sequential manner, requiring a long analysis time for completing failure analysis for all of the functional cores. For the event test system of the present invention, each pin unit has its own independent failure memory and its own memory address sequencer. Therefore, it is possible to store the failure information in the failure memories in a parallel fashion and read out the failure information in the failure analysis stage in parallel, thereby substantially decreasing the failure analysis time.

Other features of the present invention is simplicity of device zest pattern generation. When using a traditional cycle based test system, individual test pattern generation is not recommended due to its increase in device test time. To develop a test pattern block to test the device (DUT) as plural functional blocks in parallel requires much planning and it is still practically impossible not to have idle times on some of the functional blocks. With a multiple end of test implementation in the event test system of the present invention, the designer can concentrate on an individual functional block's test coverage. The test patterns for each functional block are treated as single event test program. This allows more test coverage for each functional block of the DUT in the game test time.

A further feature of the present invention is directed to a complete scalable architecture. The architecture of the test system of the present invention is scalable since the control logic for each end of test signal is the same. Each end of test signal group (pin-unit group) can contain as few as two pin units to as many as all pin units in the entire system. This architectural aspect allows future test system design expansions to handle very high pin-count VLSI devices.

According to the present invention, the event based semiconductor test system is capable of producing the events of test signals with various timings based on the event data stored in the event memory to evaluate the semiconductor device. The event based test system includes a plurality of pin units each of which is capable of producing a test signal for a specified pin of the DUT and means for generating an end of test signal with respect to each pin unit independently from the other pin units.

Therefore, the event based test system is capable of performing a plurality of different tests in a parallel fashion at the same time. Further, the event based test system can freely assign a plurality of pin units into several pin-unit groups and generate multiple signals each indicating an end of test in a corresponding pin-unit group where each pin-unit group carries out test operations independently from one another. Thus, the event based test system can perform a plurality of different tests in parallel at the same time.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event based semiconductor test system for testing a semiconductor integrated circuit device, comprising:

a plurality of pin units to be assigned to pins of a semiconductor integrated circuit device under test (DUT) for testing the DUT where each of the pin units operates independently from one another, and each of the pin units comprising:
- an event memory for storing event timing data for producing test signals to be applied to the corresponding pin of the DUT; and
- an event controller for controlling an overall operation of the pin unit by generating the test signals based on the event timing data from the event memory and evaluating a response output from the DUT;

means for generating an end of test signal based on the evaluation of the response output by the event controller for indicating an end of current test that has been performed by a corresponding pin unit where each test consists of a series of test signals applied to the DUT, the end of test signal being generated for each pin unit independently from other pin units; and a system controller for controlling an overall operation in the event based test system by communicating with the event controller in each pin unit and providing the event timing data to the event memory in each pin unit;

wherein the end of test signal for each pin unit is selected by condition specified by the system controller and the selected end of test signal is provided to the system controller and to the other pin units.

2. An event based test system as defined in claim 1, wherein the end of test signal for each pin unit includes an end of test input signal which is provided to each of the pin units as an input signal and an end of test output signal which is produced by each of the pin units as an output signal.

3. An event based test system as defined in claim 1, wherein the system controller provides event timing data for generating a next series of test signals to the pin unit which has generated an end of test signal thereby performing the next test by the pin unit.

4. An event based test system as defined in claim 1, wherein the means for generating the end of test signal includes an output control register which stores data indicating the condition for selecting the end of test signal from the pin unit wherein the selecting condition is specified by the system controller.

5. An event based test system as defined in claim 1, wherein the means for Generating the end of test signal includes an output control register which stores data indicating the condition for selecting the end of test signal from the pin unit wherein the selecting condition is specified by the system controller, gate circuits for selecting the end of test signal from the pin unit based on the selecting condition indicated by the output control register, and drivers for transmitting the selected end of test signal to the other pin units and to the system controller.

6. An event based test system as defined in claim 5, wherein outputs of the drivers for generating the end of test signals are connected to one another in a wired-OR manner.

7. An event based test system as defined in claim 1, wherein each of the pin units further comprising an event scaler for modifying the event timing data in proportion to a scaling factor, a delay controller for producing events based on an overall delay time from the event scaler, and a pin electronics for providing the test signals created by the events to the DUT with specified amplitudes and slew rates.

8. An event based semiconductor test system for testing a semiconductor integrated circuit device, comprising:
- a plurality of pin units to be assigned to pins of a semiconductor integrated circuit device under test (DUT) for testing the DUT where each of the pin units operates independently from one another, and each of the pin units comprising:
  - an event memory for storing event timing data for producing test signals to be applied to the corresponding pin of the DUT; and
  - an event controller for controlling an overall operation of the pin unit by generating the test signals based on the event timing data from the event memory and evaluating a response output from the DUT;
- a plurality of pin-unit groups each having a plurality of the pin units where the pin units are freely assigned to pin-unit groups;
- means for generating an end of test signal based on the evaluation of the response output by the event controller for indicating an end of current test that has been performed by a corresponding pin-unit group where each test consists of a series of test signals applied to the PUT, the end of test signal being generated for each pin-unit group independently from other pin-unit groups; and
- a system controller for controlling an overall operation in the event based test system by communicating with the event controller in each pin unit and providing the event timing data to the event memory in each pin unit;
- wherein the end of test signal for each pin-unit group is selected by condition specified by the system controller and the selected end of test signal is provided to the system controller and to the other pin unit in the same pin-unit group.

9. An event based test system as defined in claim 8, wherein the end of test signal for each pin unit includes an end of test input signal which is provided to each of the pin units in the same pin-unit group as an input signal and an end of test output signal which is produced by each of the pin units in the same pin-unit group as an output signal.

10. An event based test system as defined in claim 8, wherein the system controller provides event timing data for generating a next series of test signals to the pin units in the pin-unit group that has generated an end of test signal thereby performing the next test by the pin-unit group.

11. An event based test system as defined in claim 8, wherein the means for generating the end of test signal includes an output control register which stores data indicating the condition for selecting the end of test signal from the pin unit wherein the selecting condition is specified by the system controller.

12. An event based test system as defined in claim 8, wherein the means for generating the end of test signal includes an output control register which stores data indicating the condition for selecting the end of test signal from the pin unit wherein the selecting condition is specified by the system controller, gate circuits for selecting the end of test signal from the pin unit based on the selecting condition indicated by the output control register, and drivers for transmitting the selected end of test signal to the other pin units and to the system controller.

13. An event based test system as defined in claim 12, wherein outputs of the drivers for generating the end of test signals are connected with one another in a wired-OR manner.

14. An event based test system as defined in claim 8, wherein each of the pin units further comprising an event scaler for modifying the event timing data in proportion to a scaling factor, a delay controller for producing events based on an overall delay time frog the event scaler, and a pin electronics for providing the test signals created by the events to the DUT with specified amplitudes and slew rates.

* * * * *